(12) United States Patent
Numakura et al.

(10) Patent No.: US 8,571,703 B2
(45) Date of Patent: Oct. 29, 2013

(54) SYSTEM, METHOD AND STORAGE MEDIUM FOR CONTROLLING A PROCESSING SYSTEM

(75) Inventors: Masahiro Numakura, Yamanashi (JP); Keiji Osada, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 842 days.

(21) Appl. No.: 12/203,512

(22) Filed: Sep. 3, 2008

(65) Prior Publication Data

US 2009/0076648 A1    Mar. 19, 2009

Related U.S. Application Data

(60) Provisional application No. 60/991,919, filed on Dec. 3, 2007.

(30) Foreign Application Priority Data

Sep. 18, 2007    (JP) .................................. 2007-241539

(51) Int. Cl.
*G06F 7/00*    (2006.01)

(52) U.S. Cl.
USPC ........... 700/218; 700/121; 700/112; 700/108; 700/102

(58) Field of Classification Search
USPC ......................................... 700/213, 218, 228
See application file for complete search history.

(56) References Cited

U.S. PATENT DOCUMENTS

| | | | |
|---|---|---|---|
| 6,122,566 A * | 9/2000 | Nguyen et al. | 700/218 |
| 6,714,832 B1 * | 3/2004 | Nishihata et al. | 700/121 |
| 6,763,278 B1 * | 7/2004 | Coss et al. | 700/108 |
| 6,920,369 B2 * | 7/2005 | Ueno et al. | 700/121 |
| 8,190,281 B2 * | 5/2012 | Yokouchi et al. | 700/102 |
| 2005/0010320 A1 * | 1/2005 | Ueno et al. | 700/121 |
| 2005/0197729 A1 * | 9/2005 | Higashi et al. | 700/112 |
| 2006/0291988 A1 * | 12/2006 | Machiyama et al. | 414/792.7 |

FOREIGN PATENT DOCUMENTS

| | | | | |
|---|---|---|---|---|
| JP | 05226206 A | * | 9/1993 | |
| JP | 08213442 A | * | 8/1996 | |
| JP | 2001230168 A | * | 8/2001 | |
| JP | 2002-252263 | | 9/2002 | |
| JP | 2002252263 A | * | 9/2002 | |
| JP | 2002353286 A | * | 12/2002 | |

* cited by examiner

*Primary Examiner* — Gene Crawford
*Assistant Examiner* — Kyle Logan
(74) *Attorney, Agent, or Firm* — Oblon, Spivak, McClelland, Maier & Neustadt, L.L.P.

(57) ABSTRACT

A processing system includes process modules, load lock modules, an equipment controller, and a machine controller. The equipment controller controls transfer and processing of wafers in the processing system. A transfer destination determining portion determines the transfer destination of each wafer such that each wafer is sequentially transferred to a normally operating process module. When an abnormality occurs in a process module, an evacuation portion temporarily evacuates to a cassette stage the wafer determined to be transferred to the abnormal process module and that has not yet been transferred to the abnormal process module. When an error of the abnormal process module is dealt with, a transfer destination change portion changes the transfer destination of a wafer scheduled to be first transferred from the cassette case, to the transfer inhibition-released process module. When the error of the transfer-inhibited processing chamber is released, the transfer route is optimized.

12 Claims, 12 Drawing Sheets

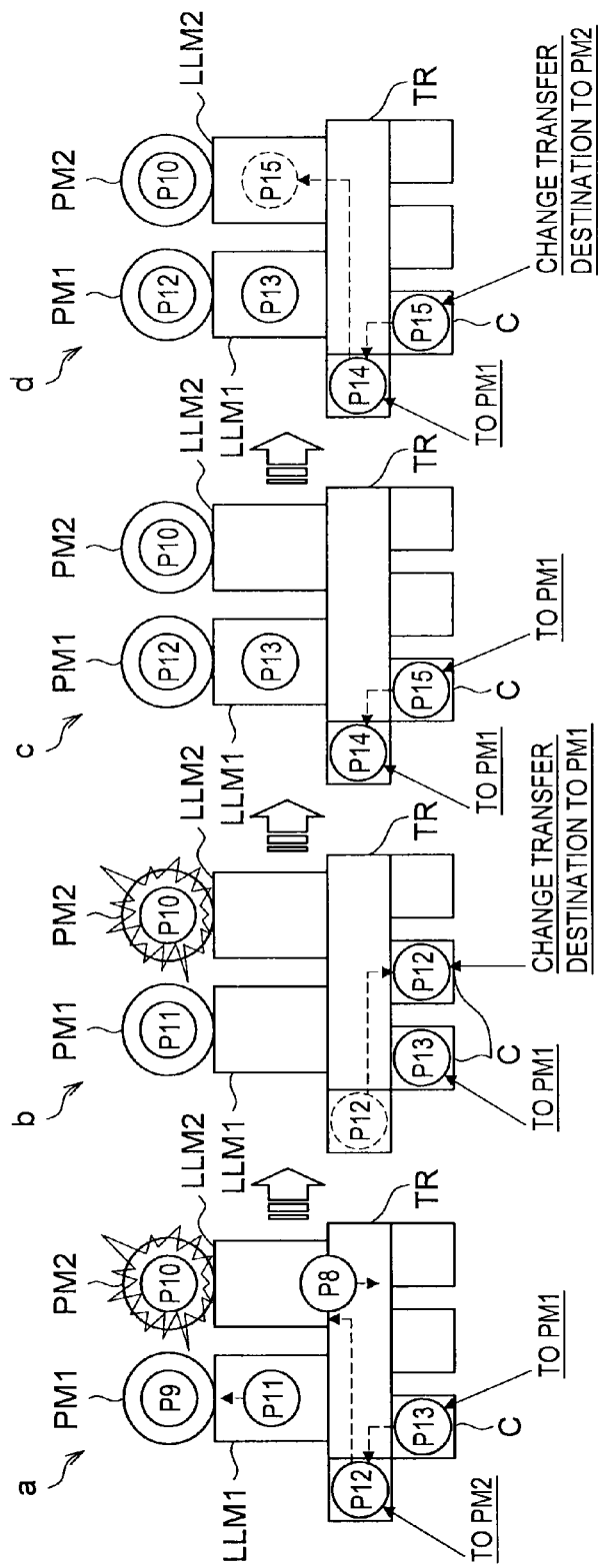
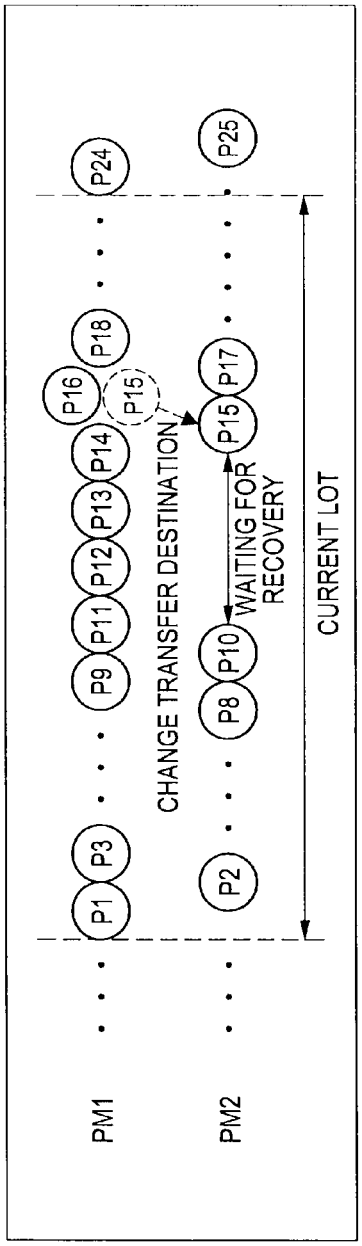
FIG. 9A
FIG. 9B

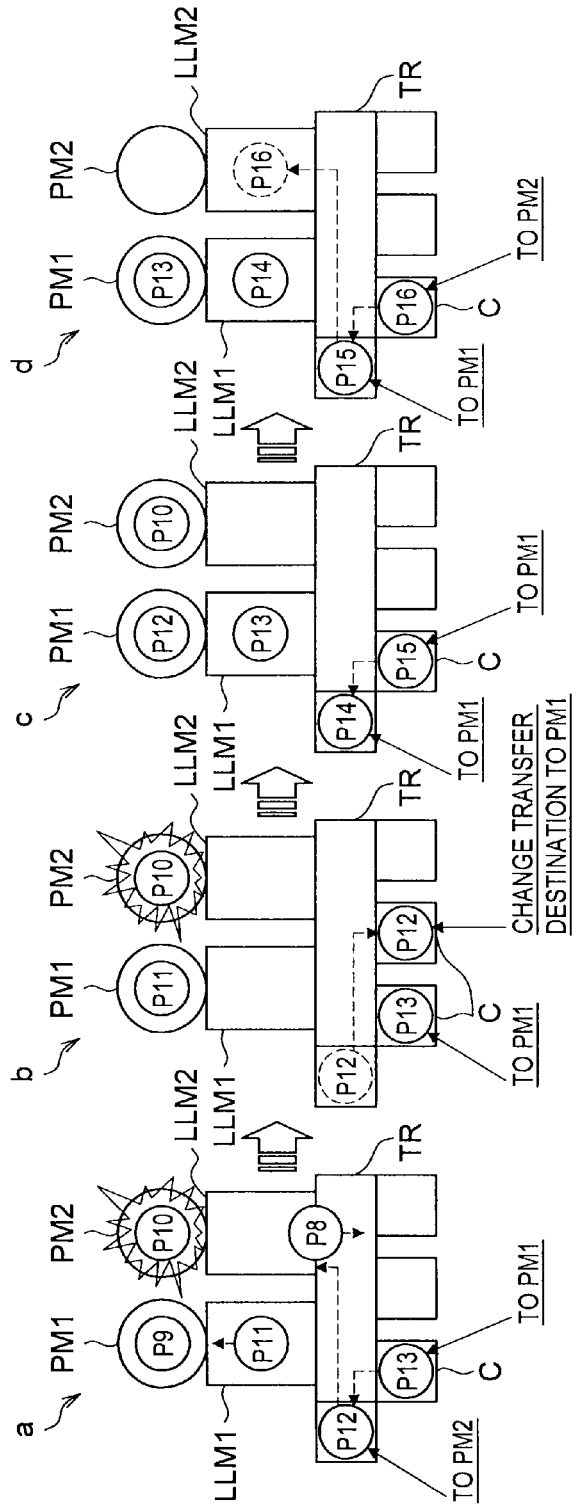
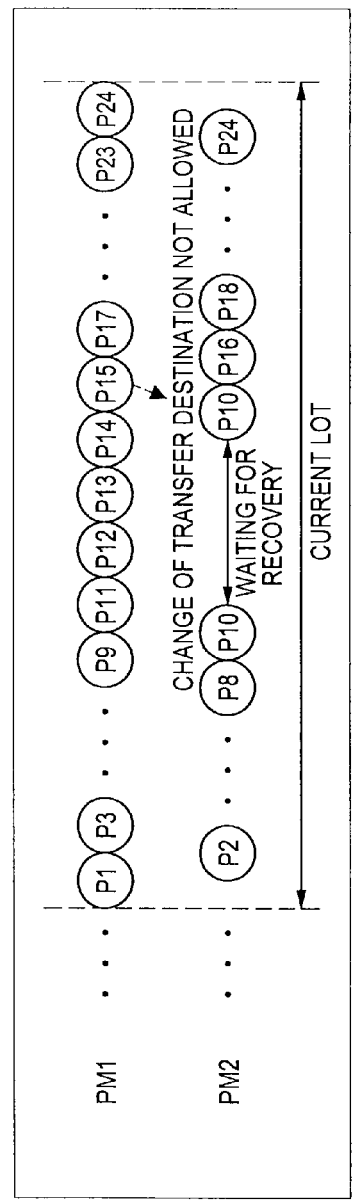
FIG. 13A
FIG. 13B

SYSTEM, METHOD AND STORAGE MEDIUM FOR CONTROLLING A PROCESSING SYSTEM

CROSS REFERENCES TO RELATED APPLICATIONS

The present invention contains subject matter related to Japanese Patent Application JP 2007-241539 filed in the Japan Patent Office on Sep. 18, 2007 and Provisional Application No. 60/991,919, filed on Dec. 3, 2007, the entire contents of which being incorporated herein by reference.

BACKGROUND OF THE INVENTION

1. Field of the Invention

The present invention relates to a control device for a processing system that performs a predetermined process on an object to be processed, a control method for the processing system, and a storage medium that stores a processing program. More specifically, the present invention relates to a method for controlling transfer of an object to be processed.

2. Description of the Related Art

In recent years, most processing systems provided in semiconductor plants include a transfer mechanism that transfers objects to be processed, and two or more processing chambers in which a predetermined process is performed on each object to be processed. In this case, the method of transferring a number of objects to be processed to a plurality of process containers is important to increase the throughput of the processing system and to improve productivity.

Given this, in order to effectively process objects to be processed, a technology has been proposed in which, when a plurality of processing chambers are operating normally, the transfer destination of each object to be processed is determined such that each object to be processed is sequentially transferred to the plurality of processing chambers (hereinafter, a method in which each object to be processed is sequentially transferred to a plurality of processing chambers is also referred to as an OR transfer). If a given processing chamber becomes unable to continue processing, the transfer route is optimized. Thus, when the transfer of an object to be processed to one of the processing chambers is inhibited due to periodic maintenance or occurrence of abnormality in the processing chamber, the object to be processed is transferred to another processing chamber while avoiding the given processing chamber. Thus, a desired process can be performed on each object to be processed by using only a processing chamber (or processing chambers) in operation.

SUMMARY OF THE INVENTION

After the transfer route is optimized by inhibition of transfer of objects to be processed to one of the processing chambers, there are cases where the inhibition of the transfer of objects to be processed to the processing chamber is released when maintenance is completed or when the processing chamber in which an abnormality has occurred is recovered. In such cases, in order to increase productivity, it is desirable to transfer wafers to the recovered processing chamber as soon as possible in accordance with the release timing, and to optimize the transfer route of wafers again including the transfer to the recovered processing chamber.

However, when the transfer inhibition is released, the transfer destination of at least one of the objects to be processed that is on the transfer route or stored in a cassette case has already been determined such that the object to be processed is transferred to a processing chamber other than the recovered processing chamber. This is because, in the semiconductor manufacturing field, generally, wafer transfer takes more time than the wafer process in the processing system of objects to be processed. Especially, this tendency is conspicuous for a process that takes a short time. Therefore, in the transfer process, in order to ensure that there is no waiting time until transference of the next object to be processed to a processing chamber after an object to be processed that has undergone processing is transferred from the processing chamber in a rate-controlled manner, the transfer destination of the next object to be processed is determined in advance. For example, the transfer destination of the next object to be processed may be determined at a timing when the preceding object to be processed is transferred from the cassette case. As a result, if the transfer-inhibited processing chamber is recovered and the transfer inhibition is released, the object to be processed whose transfer destination has already been determined before the release time cannot be transferred to the processing chamber that is released from the transfer inhibition. This causes a reduction in processing efficiency.

To address this, the present invention provides a control device for a processing system that optimizes a transfer route again in accordance with a timing at which inhibition of transfer to a processing chamber is released. The present invention also provides a control method for the processing system, and a storage medium that stores a processing program.

According to an embodiment of the present invention, there is provided a control device for a processing system that includes a plurality of processing chambers in which a predetermined process is performed on an object to be processed, a storage port that stores objects to be processed, and a transfer mechanism that transfers each object to be processed to a predetermined transfer destination between the plurality of processing chambers and the storage port. The control device includes: a transfer destination determining portion that determines a transfer destination for each object to be processed that is stored in the storage port such that each object to be processed is sequentially transferred to a processing chamber that is operating normally among the plurality of processing chambers; and a transfer destination change portion that, after transfer of an object to be processed to one of the plurality of processing chambers is inhibited, in accordance with a timing at which the inhibition of the transfer to the processing chamber is released, changes the transfer destination of at least one of the objects to be processed whose transfer destinations have already been determined by the transfer destination determining portion, to the processing chamber that is released from the transfer inhibition.

With this configuration, after the transfer of an object to be processed to one of the processing chambers is inhibited, in accordance with the timing at which the inhibition of the transfer to the processing chamber is released, the transfer destination of at least one of the objects to be processed whose transfer destinations have already been determined is changed to the processing chamber that is released from the transfer inhibition. Thus, in accordance with the timing at which the non-operating processing chamber is recovered, the object to be processed can be rapidly transferred to the recovered processing chamber. As a result, it is possible to rapidly start a desired process in the recovered processing chamber. Therefore, decrease in the throughput of the entire processing system can be suppressed as much as possible when, for example, an abnormality occurs. Therefore, high productivity can be maintained.

Particularly, as described earlier, in a system that processes wafers or substrates, generally, the wafer transfer takes more time than the wafer process. Especially, this tendency is conspicuous for a process that takes a short time. Therefore, in the transfer process, it is important to improve processing efficiency by transferring an object to be processed to the recovered processing chamber in accordance with the recovery of the processing chamber so that waiting time until the object be processed is transferred to the recovered processing chamber can be reduced as much as possible.

According to another embodiment of the present invention, there is provided a control method for a processing system that includes a plurality of processing chambers in which a predetermined process is performed on an object to be processed, a storage port that stores objects to be processed, and a transfer mechanism that transfers each object to be processed to a predetermined transfer destination between the plurality of processing chambers and the storage port. The control method includes: determining a transfer destination for each object to be processed that is stored in the storage port such that each object to be processed is sequentially transferred to a processing chamber that is operating normally among the plurality of processing chambers; and changing, after transfer of an object to be processed to one of the plurality of processing chambers is inhibited, in accordance with a timing at which the inhibition of the transfer to the processing chamber is released, the transfer destination of at least one of the objects to be processed whose transfer destinations have already been determined, to the processing chamber that is released from the transfer inhibition.

According to another embodiment of the present invention, there is provided a storage medium storing a processing program that includes instructions that command a computer to execute control of a processing system that includes a plurality of processing chambers in which a predetermined process is performed on an object to be processed, a storage port that stores objects to be processed, and a transfer mechanism that transfers each object to be processed to a predetermined transfer destination between the plurality of processing chambers and the storage port. The processing program includes the processes of: determining a transfer destination for each object to be processed that is stored in the storage port such that each object to be processed is sequentially transferred to a processing chamber that is operating normally among the plurality of processing chambers; and changing, after transfer of an object to be processed to one of the plurality of processing chambers is inhibited, in accordance with a timing at which the inhibition of the transfer to the processing chamber is released, the transfer destination of at least one of the objects to be processed whose transfer destinations have already been determined, to the processing chamber that is released from the transfer inhibition.

According to the embodiments of the present invention described above, in accordance with a timing at which the processing chamber to which the transfer of objects to be processed is inhibited is recovered, objects to be processed can be rapidly transferred to the recovered processing chamber. As a result, use efficiency of the recovered processing chamber can be improved, and the throughput of the entire processing system can be suppressed from decreasing as much as possible when, for example, an abnormality occurs. Therefore, high productivity can be maintained.

BRIEF DESCRIPTION OF THE DRAWINGS

FIG. 9A is a diagram showing the transfer state in the processing system according to the embodiment;

FIG. 9B is a diagram for explaining the transfer state shown in FIG. 9A;

FIG. 13A is another diagram showing the transfer state in the related processing system; and FIG. 13B is a diagram for explaining the transfer state shown in FIG. 13A.

DETAILED DESCRIPTION OF THE PREFERRED EMBODIMENT

Figure 1:
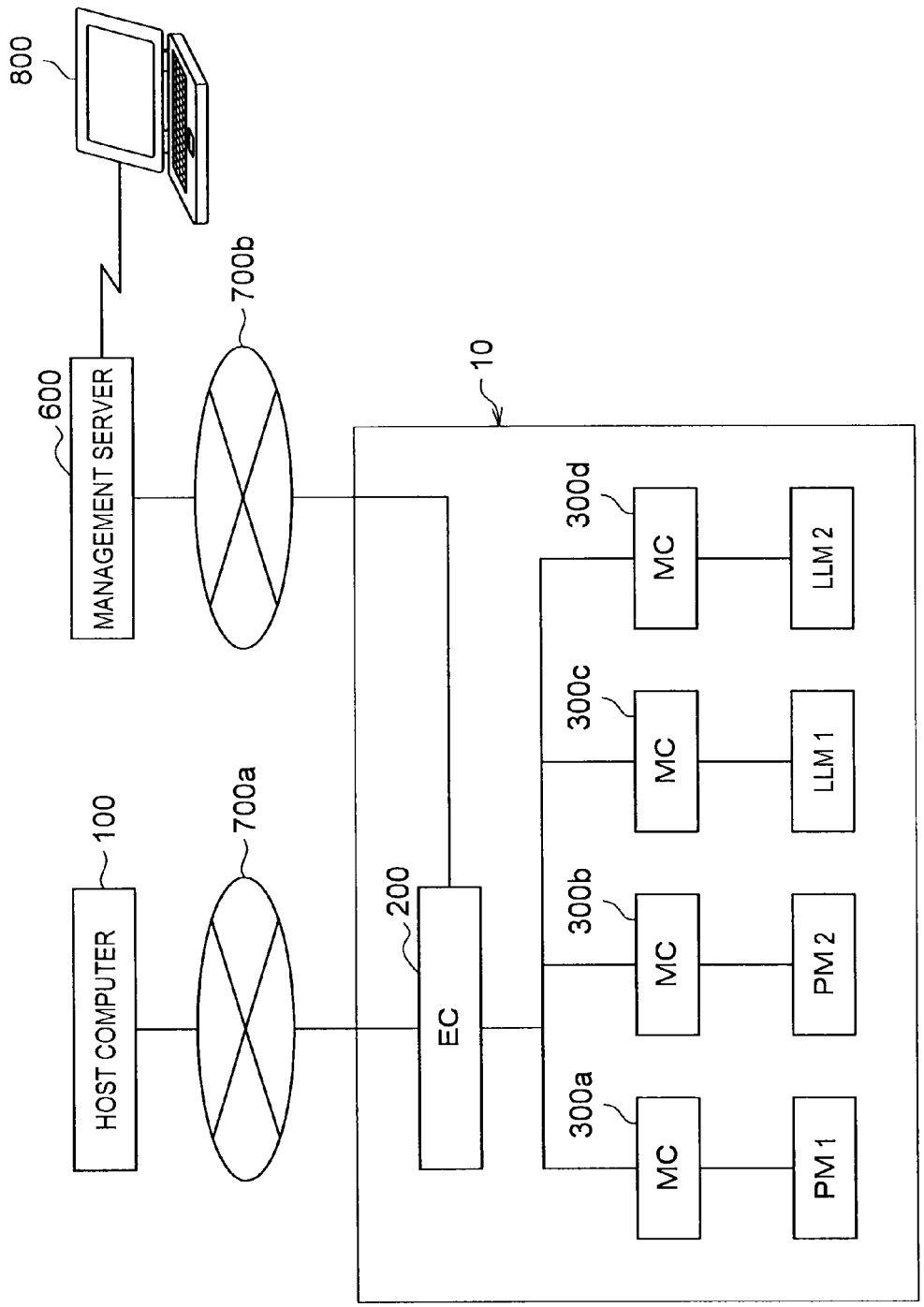
FIG. 1 is a conceptual diagram of a processing system according to an embodiment of the present invention.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

First, an outline of a processing system according to one embodiment of the present invention will be described with reference to FIG. 1. Note that, in this embodiment, an example will be described in which an etching process is performed on a silicon wafer (hereinafter also referred to as a wafer W) using the processing system.

Outline of the Processing System

A processing system 10 includes an equipment controller (EC) 200, four machine controllers (MCs) 300a to 300d, two process modules PM1, PM2, and two load lock modules LLM1, LLM2.

The EC 200 is connected to a host computer 100 and a management server 600 via customer side local area networks (LANs) 700a, 700b, respectively. The management server 600 is connected to a data processor such as a personal computer (PC) 800. An operator issues a command to the processing system 10 by operating the PC 800. The EC 200, MCs 300a to 300d, PM1, PM2, LLM1 and LLM2 are provided in a plant, and mutually inter-connected by a LAN in the plant.

The host computer 100 manages the entire processing system 10 including data management. The EC 200 stores a system recipe that shows the procedure of a wafer etching process, and transmits a control signal to each of the MCs 300a to 300d to cause the PM1, PM2, LLM 1 and LLM2 to operate according to the system recipe. The EC 200 also performs history management of the data after operation.

The MCs 300a to 300b store a process recipe, and drive each apparatus provided in the PM1 and PM2 according to the process recipe based on the control signal transmitted from the EC 200, thereby controlling the processing of the wafer W. Further, the MCs 300c to 300d drive each apparatus provided in the LLM1 and LLM2, thereby controlling the transfer of the wafer W.

The PM1 and PM2 are processing chambers in which a predetermined process, such as an etching process, is performed on the wafer W while the interior of the processing chambers is maintained in a predetermined vacuum state. The LLM1 and LLM2 are transfer chambers that transfer the wafer W from the atmosphere side into the PM in the vacuum state while the interior of the LLM1 and LLM2 is maintained in a predetermined reduced pressure state, and transfer the wafer W from the PM side to the atmosphere side. The management server 600 sets an operation condition of each device based on data transmitted from the PC 800 by operation of the operator.

Internal Structure of the Processing System

Figure 2:
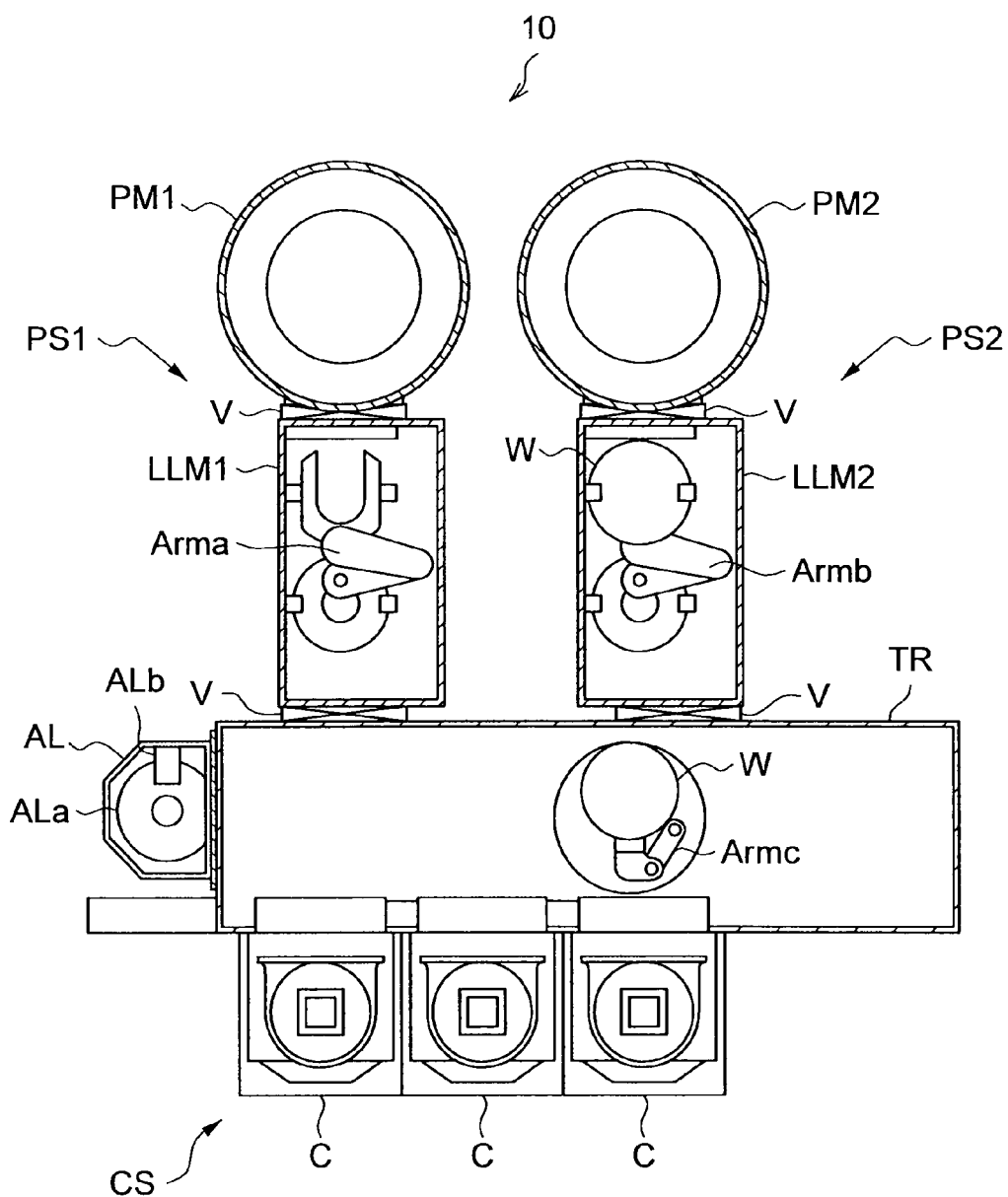
FIG. 2 is an internal configuration diagram of the processing system according to the embodiment.

Next, the internal configuration of the processing system 10 will be described with reference to FIG. 2. The processing system 10 includes a first process ship PS1, a second process ship PS2, a transfer unit TR, a alignment mechanism AL, and a cassette stage CS.

The first process ship PS1 includes the PM1 and the LLM1. The second process ship PS2 is disposed in parallel with the first process ship PS1, and includes the PM2 and the LLM2. The LLM1 and LLM2 transfer the wafers W gripped by respective transfer arms Arma, Armb, from the PM1 and PM2 to a transfer unit TR or from the transfer unit TR to the PM1 and PM2, while adjusting an internal pressure by opening and closing gate valves V that are provided at both ends of the LLM1 and LLM2.

The transfer unit TR is a rectangular transfer chamber, and is connected to the first process ship PS1 and the second process ship PS2. The transfer unit TR is provided with a transfer arm Armc, and transfers the wafer W between the cassette stage CS, the alignment mechanism AL, the first process ship PS1 and the second process ship PS2, using the transfer arm Armc in cooperation with the transfer arms Arma, Armb in the LLM1 and LLM2.

The alignment mechanism AL that performs an alignment of the wafer W is provided at one end of the transfer unit TR. The alignment mechanism AL detects the state of a wafer peripheral section using an optical sensor ALb, while rotating a turntable ALa on which the wafer W is placed, thereby positioning the wafer W.

The cassette stage CS is provided at a side of the transfer unit TR. Three cassette cases C are placed on the cassette stage CS. A plurality of wafers W are stored in the respective cassette cases C in multiple levels.

With the above configuration, the respective wafers W stored in the respective cassette cases C are transferred from the cassette cases C via the transfer unit TR. After the alignment mechanism AL performs positioning, the wafers W are transferred, one by one, alternately to the process ships PS1 and PS2. Then, each wafer W is transferred to either the PM1 or PM2, through the LLM1 or LLM2. After the etching process, each wafer W is stored again in one of the cassette cases C via the respective mechanisms. A method for transferring the wafers W, one by one, alternately to the PM1 and PM2 in this manner is referred to as an OR transfer.

Note that the PM1 and PM2 are one example of a plurality of processing chambers in which a predetermined process is performed on an object to be processed, and the cassette stage CS (the cassette cases C) is one example of a storage port that stores objects to be processed. Further, the transfer unit TR is one example of a transfer mechanism that transfers each object to be processed to a predetermined transfer destination between the plurality of processing chambers and the storage port. The EC 200 (or the MC 300) is one example of a device that controls the processing system 10. The LLM1 and LLM2 are one example of a pre-processing chamber connected to the respective processing chambers and the transfer mechanism.

Hardware Configuration of the EC and the MC

Next, the hardware configuration of the EC 200 will be described with reference to FIG. 3. Note that the hardware configuration of the MC 300 is the same as that of the EC 200, so a description thereof is omitted here.

Figure 3:
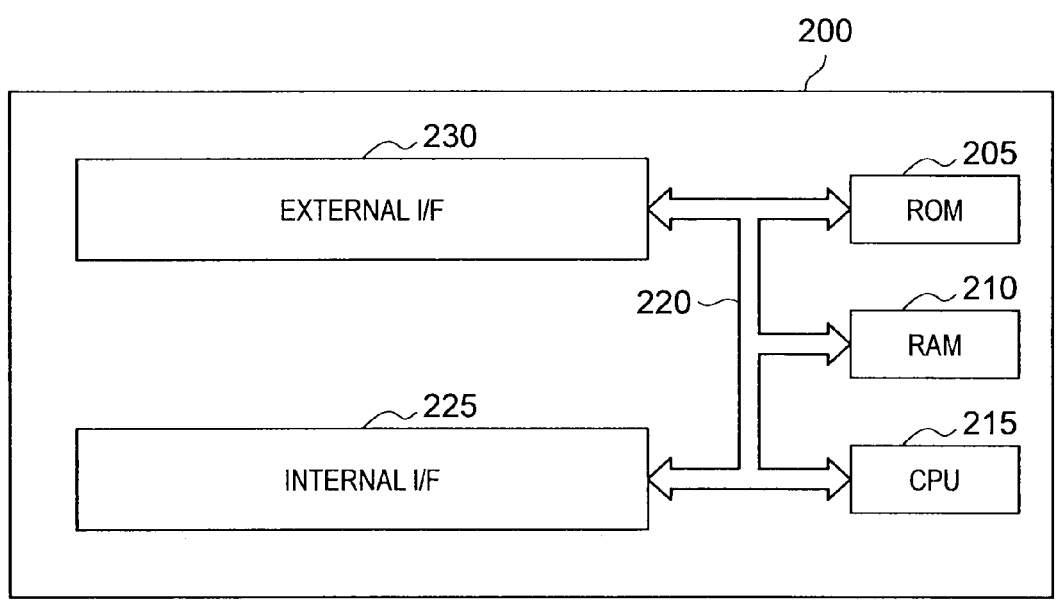
FIG. 3 is a hardware configuration diagram of an equipment controller (EC) according to the embodiment.

As shown in FIG. 3, the EC 200 includes a ROM 205, a RAM 210, a CPU 215, a bus 220, an internal interface (an internal I/F) 225, and an external interface (external I/F) 230.

A program to control a transfer process, a program to control a wafer process, a program that starts when abnormality occurs, and various recipes are recorded in the ROM 205. Various programs and data are stored in the RAM 210. Note that the ROM 205 and the RAM 210 are one example of a storage device. The ROM 205 and the RAM 210 may be a storage device, such as an EEPROM, an optical disk, or a magneto optical disk.

The CPU 215 controls the transfer and processing of wafers according to the various recipes. The bus 220 is a route for exchanging data between respective devices, namely, the ROM 205, the RAM 210, the CPU 215, the internal interface 225, and the external interface 230.

The internal interface 225 inputs data, and outputs necessary data to a monitor, a speaker (not shown in the figures), etc. The external interface 230 transmits and receives data between devices connected by a network such as a LAN.

Functional Structure of the EC

Figure 4:
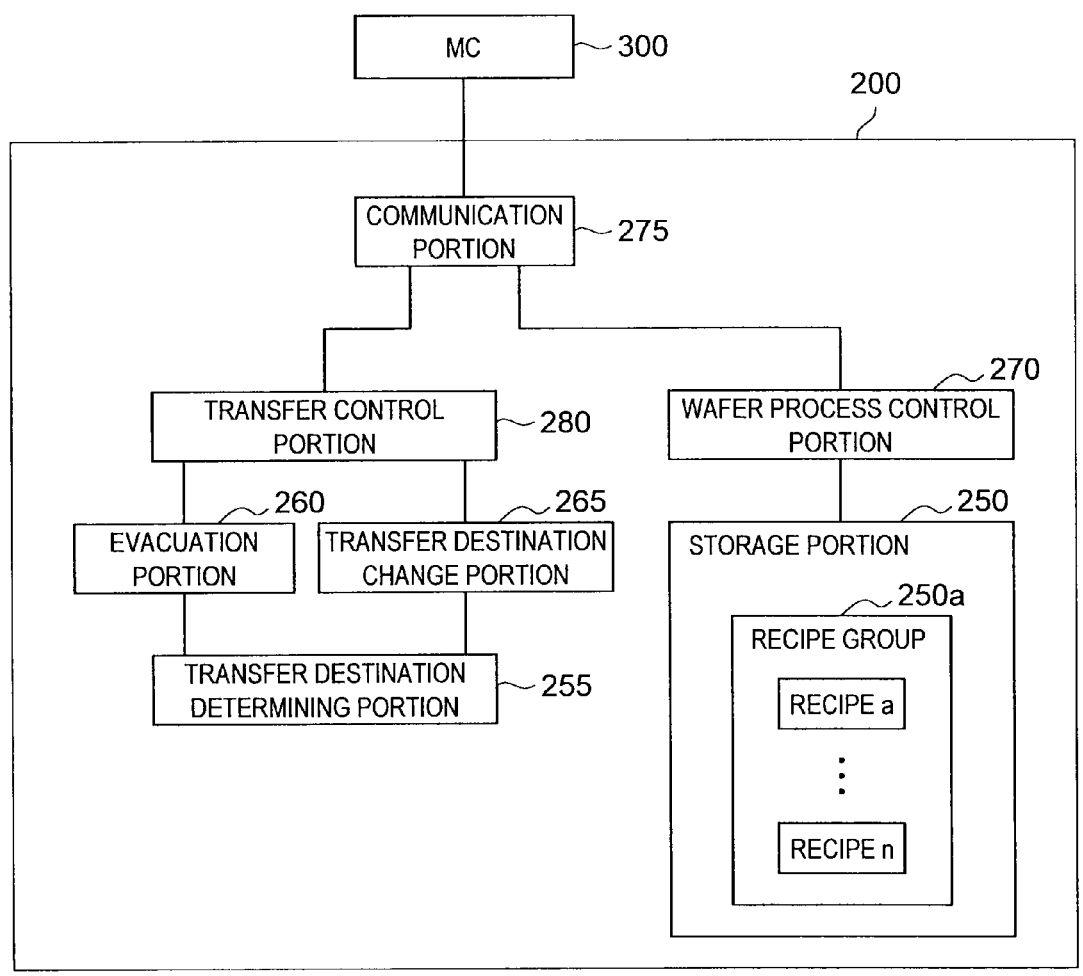
FIG. 4 is a functional configuration diagram of the EC according to the embodiment.

Next, the functional structure of the EC will be described with reference to FIG. 4 that shows respective functions of the EC 200 using blocks. The EC 200 has functions shown by respective blocks that include a storage portion 250, a transfer destination determining portion 255, an evacuation portion 260, a transfer destination change portion 265, a wafer process control portion 270, a communication portion 275, and a transfer control portion 280.

The storage portion 250 stores a recipe group 250a (recipe a to recipe n) that shows the processing procedure for applying a desired process to the wafer W in the PM1 and PM2. The transfer destination determining portion 255 determines the transfer destination of each wafer W stored in the cassette cases C on the cassette stage CS so that each wafer W is sequentially OR-transferred to a normally operating PM out of the PM1 and PM2.

In a case where transfer of the wafer W to either the PM1 or PM2 is inhibited, the evacuation portion 260 temporarily evacuates, to the cassette stage CS, the wafer W that it has been determined is to be transferred to the PM to which the transfer is inhibited and that has not yet been transferred to the PM to which the transfer is inhibited (hereinafter also referred to as the transfer-inhibited PM or the transfer-inhibited processing chamber).

After the transfer of the wafers W to one of the plurality of PMs is inhibited, in accordance with a timing at which the transfer to the processing chamber is released, the transfer destination change portion 265 changes the transfer destination of at least one of the wafers W whose transfer destinations have already been determined by the transfer destination determining portion 255, to the processing chamber that is released from the transfer inhibition (hereinafter also referred to as the transfer inhibition-released processing chamber or the transfer inhibition-released PM).

The wafer process control portion 270 selects a recipe specified by the operator from the recipes stored in the storage portion 250, and outputs a driving signal to control the etching process that is performed in each PM according to a recipe procedure. The communication portion 275 mainly transmits and receives information to and from the MC 300. The communication portion 275 transmits a driving signal for processing wafers to the MC 300, and also transmits a signal to provide instructions about the transfer destination of each wafer to the MC 300.

The transfer control portion 280 outputs a signal to transfer a predetermined wafer to a predetermined position, in accordance with instructions from the transfer destination determining portion 255, the evacuation portion 260 and the transfer destination change portion 265. The communication portion 275 transmits the signal generated by the transfer control portion 280 to the MC 300, and thereby instructs the MC 300 to perform a desired etching process in each PM.

Note that the functions of the respective portions of the EC 200 described above are actually achieved by reading a processing program from a storage medium, such as the ROM 205 or the RAM 210, that stores the processing program (including recipes) in which the processing procedure for the CPU 215 of FIG. 3 to realize these functions is written, and by interpreting and executing the processing program. For example, in this embodiment, the respective functions of the transfer destination determining portion 255, the evacuation portion 260, the transfer destination change portion 265, the wafer process control portion 270, and the transfer control portion 280 are actually achieved by the CPU 215 executing the program in which the processing procedure to realize these functions is written.

Operation of the EC

Figure 5:
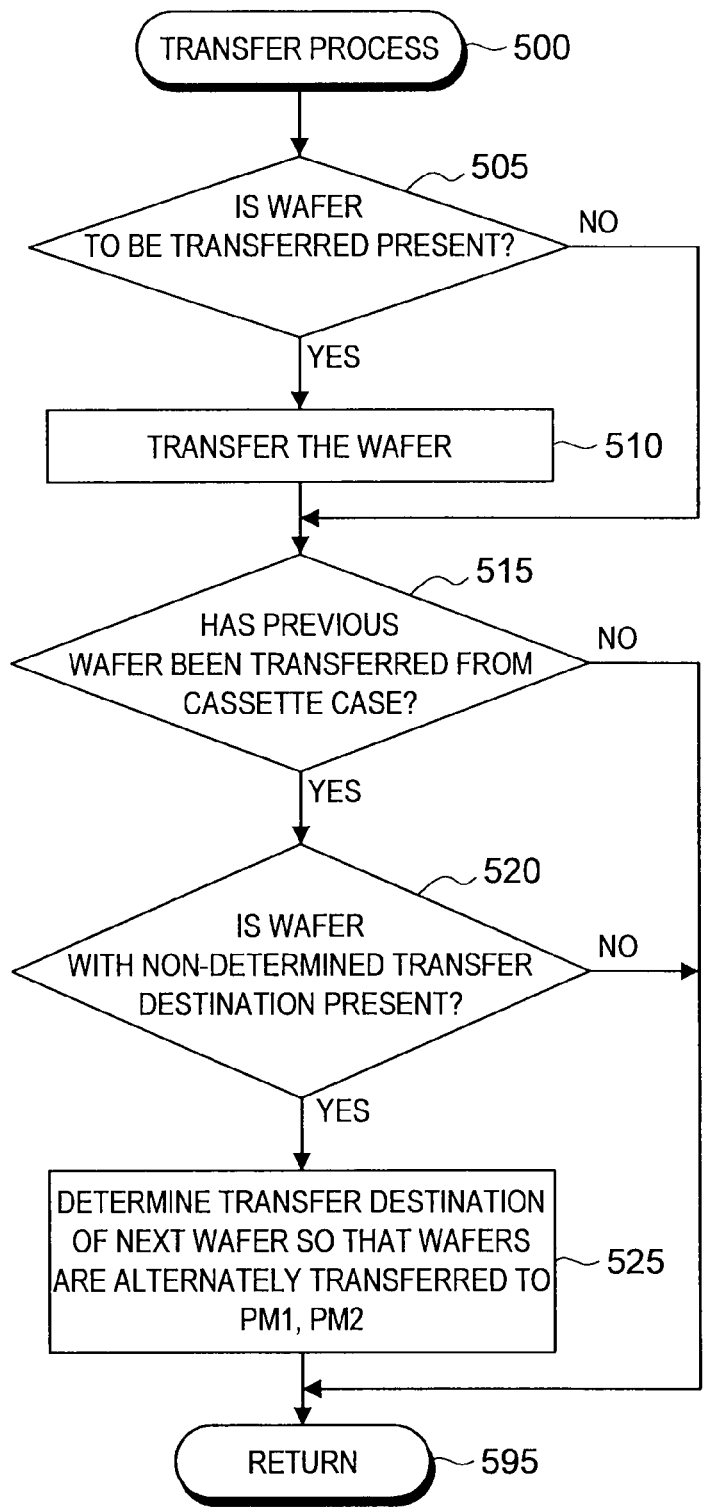
FIG. 5 is a flowchart showing a transfer process routine that is performed in the embodiment.
Figure 6:
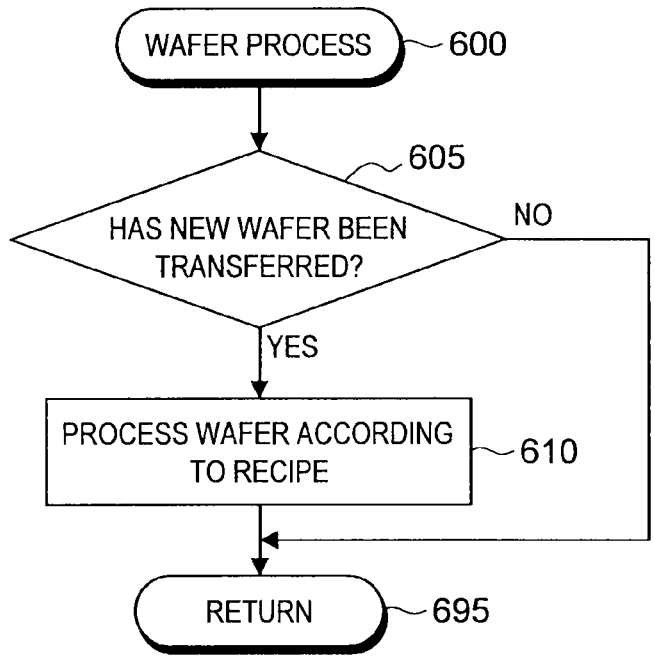
FIG. 6 is a flowchart showing a wafer process routine that is performed in the embodiment.
Figure 7:
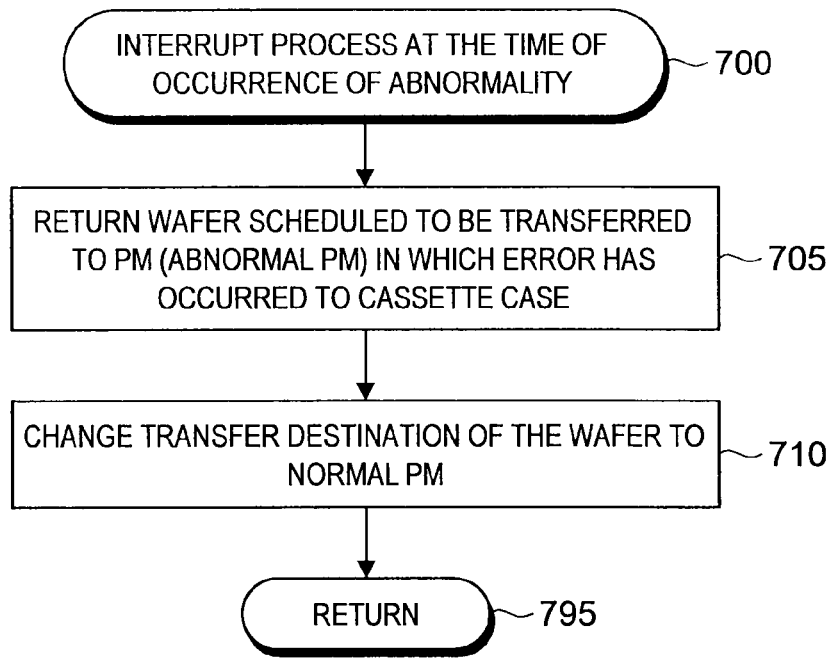
FIG. 7 is a flowchart showing an interrupt process routine at the time of occurrence of abnormality that is performed in the embodiment.
Figure 8:
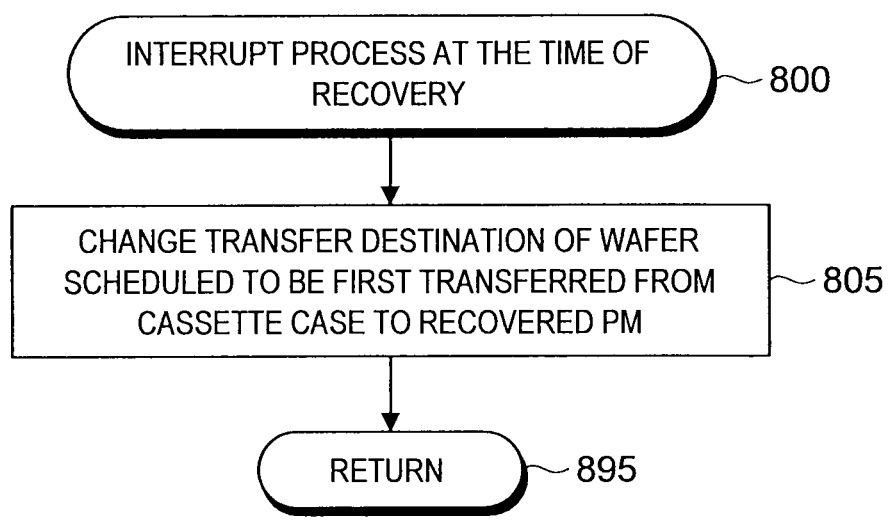
FIG. 8 is a flowchart showing an interrupt process routine at the time of recovery that is performed in the embodiment.

Next, the transfer process, the wafer process, an interrupt process at the time of occurrence of abnormality, and an interrupt process at the time of recovery that are performed by the EC 200 will be described. The transfer process shown in a flowchart in FIG. 5, and the wafer process shown in a flowchart in FIG. 6 are separately activated at predetermined intervals. The interrupt process at the time of occurrence of abnormality shown in a flowchart in FIG. 7 is activated as an interrupt process when an abnormality occurs, and the interrupt process at the time of recovery shown in a flowchart in FIG. 8 is activated as an interrupt process when the processing chamber in which an abnormality has occurred is recovered.

When the operator specifies the recipe and the lot number and switches on a lot start button, the lot is loaded, and preparation for sequentially transferring wafers included in the lot is completed. In accordance with this timing, the transfer process shown in FIG. 5 is started from step 500, and the wafer process shown in FIG. 6 is started from step 600.

Figure 12A:
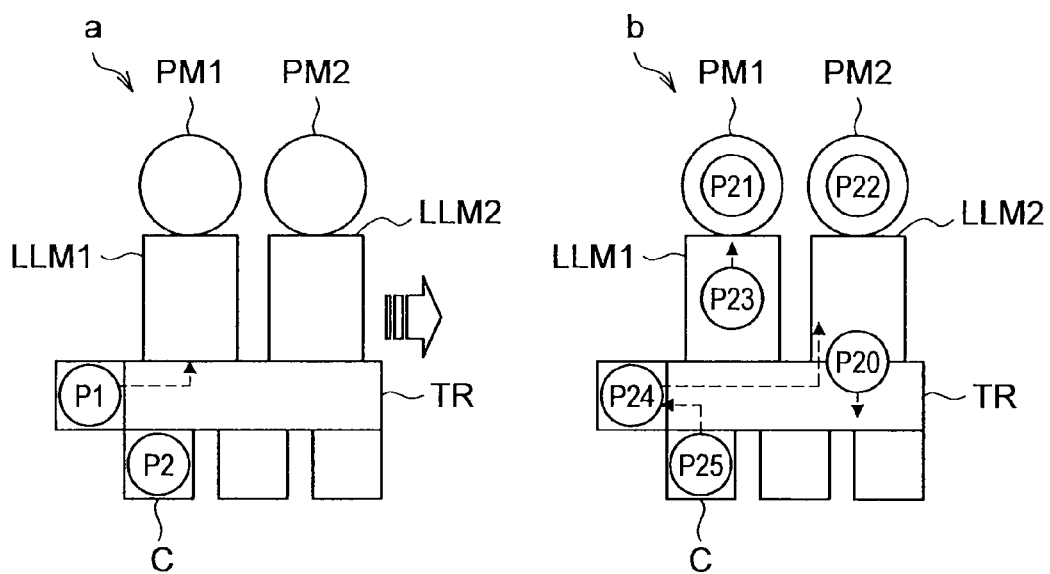
FIG. 12A is a diagram showing the transfer state in a related processing system.
Figure 12B:
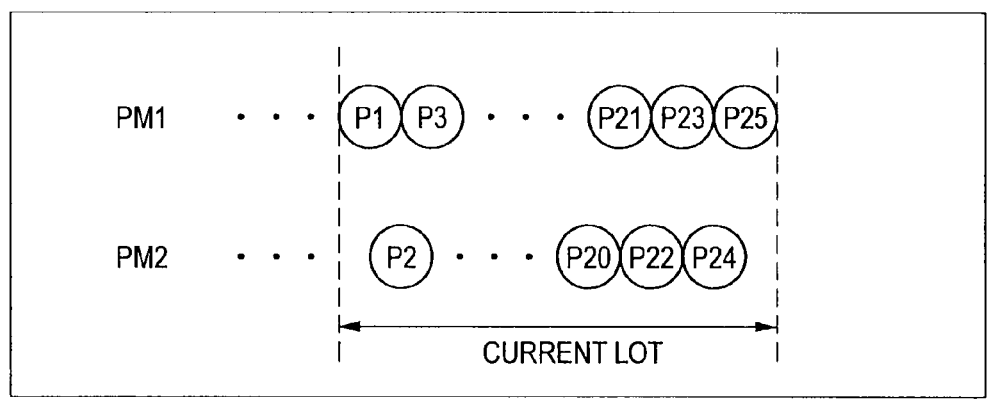
FIG. 12B is a diagram for explaining the transfer state shown in FIG. 12A.

In this embodiment, as shown in FIG. 12B, each lot includes 25 sheets of product wafers P1 to P25. Note that each lot may include wafers for a cleaning process and wafers for a seasoning process (not shown in the figures), in addition to the product wafers.

In a normal state where the PM1 and PM2 are operating normally, the transfer destination of each wafer W is determined such that the wafers W are transferred, one by one, alternately to the PM1 and PM2 (OR transfer). Accordingly, it is determined that the first product wafer P1 of the lot number specified by the operator is to be transferred to the PM1, and it is determined that the second product wafer P2 is to be transferred to the PM2.

Transfer Process

The transfer process is started from step 500 of FIG. 5, and the transfer control portion 280 determines at step 505 whether or not a wafer to be transferred is present. At this time point, the product wafer P1 to be transferred is present. Therefore, the transfer control portion 280 outputs an instruction signal to transfer the product wafer P1 to the transfer destination PM1. This instruction signal is transmitted from the communication portion 275 to the MC 300, and the MC 300 performs control to cause the transfer mechanism of each PM to be driven. Thus, the OR transfer of each wafer is started. When there is no wafer to be transferred, the process skips step 510 and proceeds to the next step 515.

The transfer destination determining portion 255 determines at the next step 515 whether or not the previous wafer has been transferred from the cassette case C. Generally, in the processing system 10, the wafer transfer takes more time than the wafer process. Especially, this tendency is conspicuous for a process that takes a short time. Therefore, in the transfer process of this embodiment, the transfer destination of the next wafer is determined at a timing when the previous wafer is carried out from the cassette case C toward the transfer unit TR so that there is no waiting time until the next wafer to be processed is transferred to the PM after the processed wafer is transferred from the PM in a rate-controlled manner.

Note that, instead of determining the transfer destination of the next wafer in accordance with the timing when the previous wafer is carried out from the cassette case C toward the transfer unit TR as described above, the transfer destination determining portion 255 may determine the transfer destination of the next wafer in accordance with the timing when the previous wafer is carried out from the transfer unit TR toward the LLM.

At this time point, the wafer P1 has already been transferred from the cassette case C. Therefore the process proceeds to step 520, and the transfer destination determining portion 255 determines whether or not the wafer, the transfer destination of which has not been determined, is present in the specified lot. At this time point, the transfer destinations of the wafers P2 . . . P25 included in the current lot have not been determined. Therefore, the process proceeds to step 525, and the transfer destination determining portion 255 determines that the next wafer P2 is to be transferred to the PM2 so that each wafer is transferred alternately to the PM1 and PM2. Then, the process proceeds to step 595 and the process is terminated once. In this state, as shown in FIG. 12A(a), the product wafer P1 is being transferred toward the PM1 that is the transfer destination, and the product wafer P2 scheduled to be transferred to the PM 2 is waiting in the cassette case C.

On the other hand, when it is determined at step 515 that the previous wafer has not been transferred from the cassette case C, or when it is determined at step 520 that the wafer, the transfer destination of which has not been determined, is not present in the specified lot, the process immediately proceeds to step 595 and the process is terminated once.

In this manner, when one of the product wafers is transferred from the cassette case, the transfer destination of the next product wafer is determined so that the OR-transfer is performed. By repeating this, 25 sheets of product wafers are transferred alternately to the PM1 and PM2, and processed therein, as shown in FIG. 12B.

Wafer Process

The wafer process is started from step 600 of FIG. 6, and the wafer process control portion 270 determines at step 605 whether or not a new wafer has been transferred. When a new wafer has been transferred, the process proceeds to step 610, and the wafer process control portion 270 performs control such that the etching process is performed on the wafer according to a recipe that is specified by the operator from the recipe group 250a stored in the storage portion 250. Then, the process proceeds to step 695 and the process is terminated once. When there is no newly transferred wafer, the process immediately proceeds to step 695 and the process is terminated once.

This completes the description of the transfer process routine and the wafer process routine during normal operation. Next, the process performed at the time of occurrence of abnormality will be described. As shown in FIG. 13A(a), for example, if an abnormality occurs in the PM2 during the processing of the product wafer P10, and the transfer of wafers to the PM2 is thereby inhibited, the interrupt process at the time of occurrence of abnormality shown in FIG. 7 is activated. In this case, at the time point when the product wafer P12 is carried out the cassette case C, it is determined that the transfer destination of the product wafer P13 is the PM1.

Interrupt Process at the Time of Occurrence of Abnormality

The interrupt process at the time of occurrence of abnormality is started from step 700. Then, at step 705, the evacuation portion 260 evacuates, to the cassette case C, the wafer that is scheduled to be transferred to the PM in which an abnormality (an error) has occurred (hereinafter the PM in which an abnormality has occurred is also referred to as the abnormal PM) and that has not yet been transferred. In the case shown in FIG. 13B, the product wafer P12 that is scheduled to be transferred to the abnormal PM2 and that has not yet been transferred is temporarily evacuated to the cassette case C. Here, the evacuation portion 260 determines whether or not the wafer has been transferred based on whether or not the wafer has been transferred to the LLM. More specifically, as shown in FIG. 13A(a), when an abnormality occurs in the PM2, it is determined that the product wafers P8, P9, P10 and P11 have already been transferred, but the product wafers P12 and P13 have not yet been transferred.

Then, the process proceeds to step 710, and the transfer destination determining portion 255 changes the transfer destination of the evacuated wafer to the normal PM. As a result, as shown in FIG. 13B, the transfer destination of the evacuated wafer P12 is changed from the abnormal PM2 to the normal PM1. Therefore, the evacuated wafer can be processed in the normal PM1 without waiting for recovery of the abnormal PM2. Thus, rapid processing can be achieved when abnormalities occur.

In this manner, after the abnormality has occurred in the PM2, the normal PM1 is determined as the transfer destination of the product wafer P12. The product wafer P12 and subsequent wafers are transferred to the PM1 by performing the transfer process shown in FIG. 5 at predetermined intervals. Then, the etching process is performed on the product wafer P12 and subsequent wafers in the PM1 by performing the wafer process shown in FIG. 6 at predetermined intervals.

Transfer Situations and Issues That Can Occur During the OR Transfer

Issues that may occur when an error of the abnormal PM2 is dealt with and the PM2 is recovered in the above transfer situation will be described with reference to FIG. 13A(c) and FIG. 13A(d). As shown in FIG. 13A(c), it is assumed that the error of the abnormal PM2 is dealt with when the etching process is being performed on the product wafer P12 in the normal PM1. At this time, the product wafer P14 has already been transferred from the cassette case C, and it has already been determined that the transfer destination of the next product wafer P15 is the PM1.

Therefore, when it becomes possible to perform the wafer process in the recovered PM2, unless the product wafer P15 whose transfer destination has already been determined is transferred from the cassette case C, the recovered PM2 cannot be determined as the transfer destination of a wafer. As a result, as shown in FIG. 13A(d), after the product wafer P15 has been transferred, eventually it can be determined that the product wafer P16 is to be transferred to the PM2.

More specifically, as shown in FIG. 13B, although one of the wafers can be immediately processed in the PM2, the recovered PM2 cannot be determined as the transfer destination of the next product wafer P16 for a time period that extends from when the product wafers P12, P13 are processed in the PM1, to when the product wafer P14 is transferred to the LLM1, and up until the product wafer P15 is carried out the cassette case C. Accordingly, the PM2 is in an idle state for a long time period up until when the product wafer P16 is actually transferred from the cassette case C, subjected to an alignment process, transferred to the LLM2, and finally transferred to the PM2. As a result, the operation rate of the entire processing system decreases, and the throughput decreases, leading to a decrease in productivity. In the first place, the processing efficiency decreases due to the abnormality in the PM. In this state, if the recovered PM is not used and held in an idle state for a certain period of time after the recovery of the PM, the processing capacity of the recovered apparatus in the PM decreases, and the processing efficiency of the entire processing system also decreases.

In order to solve the above issue, in the processing system 10 according to the embodiment, when an error of any one of the PMs is dealt with, an interrupt signal indicating release of the inhibition of wafer transfer to the PM2 is output from the MC 300 to the EC 200. The CPU 215 of the EC 200 that receives the interrupt signal performs the interrupt process at the time of recovery shown in FIG. 8.

Interrupt Process at the time of Recovery

The interrupt process at the time of recovery is started from step 800. Then, at step 805, the transfer destination change portion 265 changes the transfer destination of the wafer scheduled to be first transferred from the cassette case C to the recovered PM. Then, the process proceeds to step 895, and the process is terminated.

With the above interrupt process, for example, although it has been determined that the product wafer P15 shown in FIG. 9A(c) is scheduled so as to be transferred to the PM1, the transfer destination of the product wafer P15 can be changed to the PM2 as shown in FIG. 9A(d). As a result, irrespective of the progress status of the process in the PM1, it is possible to immediately transfer the product wafer P15 from the cassette case C, transfer it to the LLM2 after the alignment process, and further transfer it to the PM2. This allows the etching process on the product wafer P15 in the PM2 to be performed without wasting time.

As described above, in the processing system 10 according to the embodiment, wafers can be rapidly transferred to the recovered PM in accordance with the recovery timing of the PM. Thus, use efficiency of the recovered processing chamber can be improved, and decrease in the throughput of the entire processing system can be suppressed as much as possible when, for example, an abnormality occurs. Therefore, high productivity can be maintained.

Note that, in the above description, the transfer destination change portion 265 changes the transfer destination of the wafer that is stored in the cassette case C and that is first transferred from the cassette case C among the wafers whose transfer destinations have already been determined by the transfer determination determining portion 255, to the transfer inhibition-released PM.

However, the target whose transfer destination is changed is not limited to the above-described wafer. For example, after the wafer transfer to one of the plurality of PMs is inhibited, in accordance with a timing at which the inhibition of the transfer to the PM is released, the transfer destination change portion 265 may change the transfer destination of at least one of the wafers whose transfer destinations have already been determined by the transfer destination determining portion 255, to the transfer inhibition-released PM.

For example, if the wafer that is stored in the cassette case C and that is first transferred from the cassette case C among the wafers whose transfer destinations have already been determined is a cleaning wafer, there is a case when the cleaning wafer should not be transferred to the recovered PM. In this case, the transfer destination of a wafer other than the cleaning wafer is changed.

Further, in accordance with a timing at which the inhibition of the transfer to the PM is released, the transfer destination change portion 265 may change, to the transfer inhibition-released PM, the transfer destination of at least one of the wafers whose transfer destinations have already been determined. Examples of wafers whose transfer destination may be changed include an evacuated wafer for which a new transfer destination has been determined by the transfer destination determining portion 255.

Furthermore, the transfer destination change portion 265 may change the transfer destination of at least one of the wafers stored in the cassette case C among the wafers whose transfer destinations have already been determined by the transfer destination determining portion 255, to the transfer inhibition-released PM.

Further, in accordance with a timing at which a wafer is carried out the cassette case C toward the transfer unit TR, the transfer destination determining portion 255 may determine the transfer destination of the wafer that is next carried out the cassette case C. Alternatively, in accordance with a timing at which a wafer is carried out the transfer unit TR toward the LLM, the transfer destination determining portion 255 may determine the transfer destination of the wafer that is next carried out the cassette case C.

During periodic maintenance of one of the PMs or when an abnormality occurs in one of the PMs, the evacuation portion 260 may determine that wafer is inhibited to transfer to the above-described PM. Further, when the periodic maintenance of the PM is completed or when the PM in which the abnormality has occurred is recovered, the transfer destination change portion 265 may determine that the inhibition of the transfer to the above-described PM is released.

In a case where a new transfer destination is determined for a wafer that has been temporarily evacuated to the cassette case C by the evacuation portion 260, based on the process that is performed in the new transfer destination immediately before processing the evacuated wafer, it may be determined when the evacuated wafer is to be processed that the atmosphere of the inside of the PM has not been adjusted to a stable condition, or it may be determined when the evacuated wafer is to be processed that the atmosphere of the inside of the PM has been adjusted to receive a lot next to the lot including the evacuated wafer. In such cases, the transfer of the evacuated wafer to the new transfer destination may be inhibited.

The respective processes and operations described above will be briefly outlined. For example, the control device for the processing system may further include an evacuation portion that temporarily evacuates, to the storage port, the object to be processed that it has been determined is to be transferred to the processing chamber to which the transfer is inhibited and that has not yet been transferred to the processing chamber to which the transfer is inhibited. The transfer destination determining portion may sequentially determine a new transfer destination of the evacuated object to be processed and transfer destinations of the other objects to be processed stored in the storage port. In accordance with the timing at which the inhibition of the transfer to the processing chamber is released, the transfer destination change portion may change the transfer destination of at least one of the objects to be processed whose transfer destinations have already been determined, including the evacuated object to be processed for which the transfer destination determining portion has determined the new transfer destination, to the processing chamber that is released from the transfer inhibition.

With this configuration, the object to be processed that it has been determined is to be transferred to the transfer-inhibited processing chamber and that has not yet been transferred to the transfer-inhibited processing chamber is temporarily evacuated to the storage port. After that, when the inhibition of the transfer to the processing chamber is released, the transfer destination of at least one of the objects to be processed whose transfer destinations have already been determined including the evacuated object to be processed, is changed to the transfer chamber that is released from the transfer inhibition. Thus, when the transfer inhibition is released, the transfer route can be optimized again including the evacuated object to be processed. Therefore, objects to be processed can be rapidly transferred to the recovered processing chamber, and the use efficiency of the recovered processing chamber can be improved.

The transfer determination change portion may change the transfer destination of at least one of the objects to be processed stored in the storage port among the objects to be processed whose transfer destinations have already been determined by the transfer destination determining portion, to the processing chamber that is released from the transfer inhibition.

The transfer destination change portion may change the transfer destination of an object to be processed that is stored in the storage port and that is first transferred from the storage port among the objects to be processed whose transfer destinations have already been determined by the transfer destination determining portion, to the processing chamber that is released from the transfer inhibition.

In accordance with a timing at which an object to be processed is carried out the storage port toward the transfer mechanism, the transfer destination determining portion may determine a transfer destination of an object to be processed that is next transferred from the storage port.

In accordance with a timing at which an object to be processed is carried out the transfer mechanism toward the pre-processing chamber, the transfer destination determining portion may determine a transfer destination of an object to be processed that is next transferred from the storage port.

During periodic maintenance of any one of the plurality of processing chambers, or when an abnormality occurs in any one of the processing chambers, the evacuation portion may determine that the transfer of an object to be processed to the given processing chamber is inhibited.

When the periodic maintenance is completed, or when the processing chamber in which the abnormality has occurred is recovered, the transfer destination change portion may determine that the inhibition of the transfer to the given processing chambers is released.

Note that the processing system may be a system that processes a wafer or a substrate.

As described above, according to the present invention, it is possible to rapidly transfer an object to be processed to a recovered processing chamber in accordance with the recovery timing of the processing chamber that has not been operated.

In the above-described respective embodiments, the operations of the respective portions are associated with each other, and can be replaced with a series of operations taking the relationship thereof into consideration. Thus, the embodiment of a control device for the processing system can be changed into the embodiment of a control method for the processing system. Further, by substituting the operations of the respective portions with the processes of the respective portions, the embodiment of the control method for the processing system can be changed into the embodiment of a processing program for controlling the processing system. Furthermore, by storing the processing program for controlling the processing system in a computer readable storage medium, the embodiment of the processing program for controlling the processing system can be changed into the embodiment of a computer readable storage medium that stores the processing program.

It should be understood by those skilled in the art that various modifications, combinations, sub-combinations and alterations may occur depending on design requirements and other factors insofar as they are within the scope of the appended claims or the equivalents thereof.

First Modified Example of the Processing System

Figure 10:
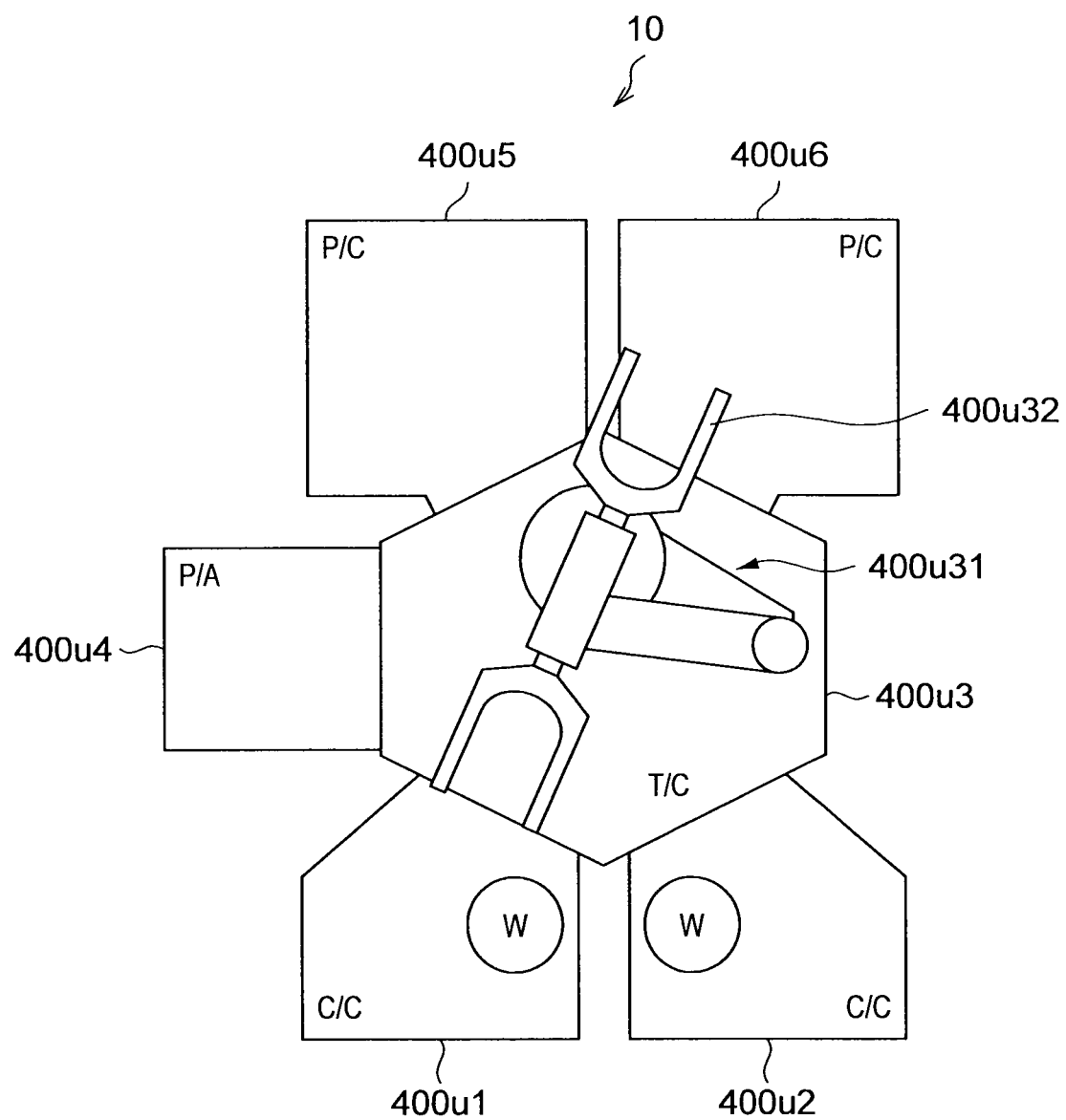
FIG. 10 is another internal configuration diagram of the processing system.

For example, the processing system 10 that performs the above-described transfer process (FIG. 5), wafer process (FIG. 6), interrupt process at the time of occurrence of abnormality (FIG. 7), and interrupt process at the time of recovery (FIG. 8) may have the configuration shown in FIG. 10. The processing system 10 includes cassette chambers (C/C) 400$u$1, 400$u$2, a transfer chamber (T/C) 400$u$3, a pre-alignment (P/A) 400$u$4, and processing chambers (P/C) (=PM) 400$u$5, 400$u$6.

The C/C 400$u$1, 400$u$2 store wafers to be unprocessed and processed wafers, as well as cleaning wafers and lot stabilizing dummy wafers. The P/A 400$u$4 performs positioning of the wafer W.

The T/C 400$u$3 is provided with an articulated arm 400$u$31 that can bend, stretch and turn. The arm 400$u$31 has an end provided with a fork 400$u$32 on which a wafer is held, and transfers the wafer between the C/C 400$u$1, 400$u$2, the P/A 400$u$4, and the P/C 400$u$5, 400$u$6, while bending, stretching and turning as necessary.

With the above configuration, the processing system 10 transfers the wafer from the C/C 400$u$1, 400$u$2, via the T/C 400$u$3 and the P/A 400$u$4, to the P/C 400$u$5, 400$u$6, using the arm 400$u$31 of the T/C 400$u$3. After performing a process such as an etching process on the wafer, the processing system 10 transfers the processed wafer to the C/C 400$u$1, 400$u$2, via the T/C 400$u$3 again.

Second Modified Example of the Processing System

Figure 11:
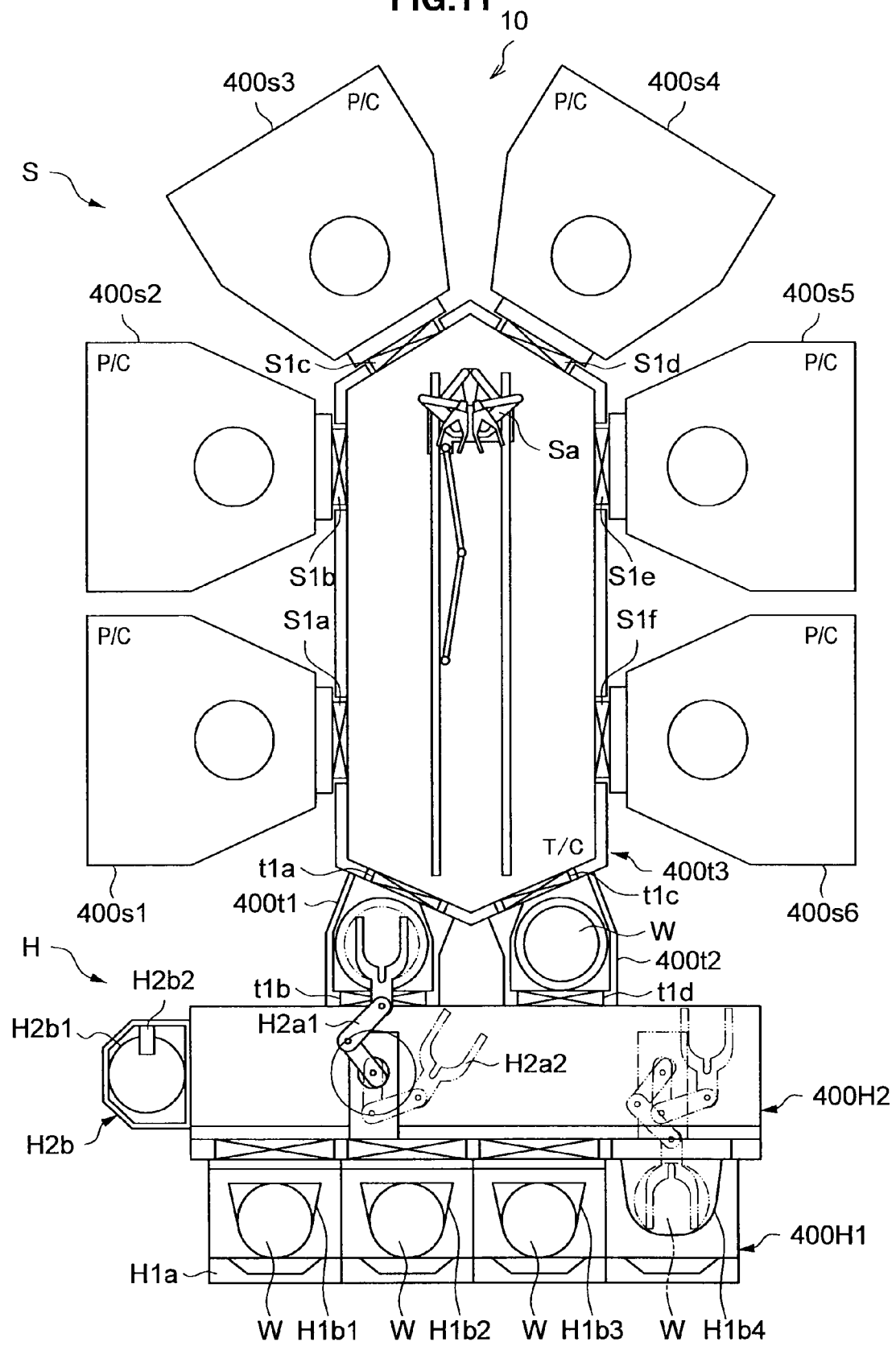
FIG. 11 is another internal configuration diagram of the processing system.

Further, the processing system 10 of the present invention may have a configuration as shown in FIG. 11. The processing system 10 includes a transfer system H that transfers the wafer W, and a processing system S that performs a process such as a deposition process or an etching process on the wafer W. The transfer system H and the processing system S are connected via LLM 400$t$1, 400$t$2.

The transfer system H includes a cassette stage 400H1 and a transfer stage 400H2. The cassette stage 400H1 is provided with a cassette case susceptor H1$a$. Four cassette cases H1$b$1 to H1$b$4 are placed on the cassette case susceptor H1$a$. Each cassette case H1$b$ stores, in multiple levels, the wafers W to be unprocessed, processed wafers, and wafers for dummy process used for cleaning and seasoning.

Two transfer arms H2$a$1, H2$a$2 that can bend, stretch and turn are supported by the transfer stage 400H2 such that the transfer arms H2$a$1, H2$a$2 slide when they are magnetically driven. Each of the transfer arms H2$a$1, H2$a$2 has an end provided with a fork on which the wafer W is held.

A alignment mechanism H2$b$ that performs positioning of the wafer W is provided at an end of the transfer stage 400H2. The alignment mechanism H2$b$ detects the state of a peripheral section of the wafer W using an optical sensor H2$b$2, while rotating a turntable H2$b$1 on which the wafer W is placed, thereby positioning the wafer W.

A susceptor on which the wafer W is placed is provided in each of the LLM 400$t$1, 400$t$2, and gate valves t1$a$, t1$b$, t1$c$, t1$d$ are provided at opposite ends of the LLM 400$t$1, 400$t$2. With this configuration, the transfer system H transfers the wafer W between the cassette cases H1$b$1 to H1$b$4, the LLM 400$t$1, 400$t$2, and the alignment mechanism H2$b$.

The processing system S includes a transfer chamber (T/C) (=TM) 400$t$3 and six processing chambers (P/C) 400$s$1 to 400$s$6 (=PM). The transfer chamber T/C 400$t$3 is connected to the P/C 400$s$1 to 400$s$6 via gate valves s1$a$ to s1$f$, respectively. The T/C 400$t$3 is provided with an arm Sa that can bend, stretch and turn.

With the above configuration, the processing system 10 transfers the wafer, which has been transferred from the transfer system H to the processing system S, from the LLM 400$t$1, 400$t$2, via the T/C 400$t$3, to the P/C 400$s$1 to 400$s$6, using the arm Sa. After performing a process such as an etching process on the wafer, the processing system 10 transfers the processed wafer to the LLM 400$t$1, 400$t$2, via the T/C 400$t$3 again. Each of the transfer arms H2$a$1, H2$a$2 receives the processed wafer and returns it to the cassette case H1$b$.

As shown in FIG. 10 and FIG. 11, also in the processing system 10 having three or more PMs, the wafers are sequentially transferred to the respective P/Cs. The concept of the OR transfer includes a case in which wafers are sequentially transferred to three or more PMs (processing chambers) in this manner. Also in this case, by performing the interrupt process at the time of occurrence of abnormality as shown in FIG. 7, respective objects to be processed can be transferred to a plurality of processing chambers appropriately, depending on the condition of processing chambers that are operating normally and the condition of a processing chamber in which an abnormality has occurred. Further, when the abnormal PM is recovered, wafers can be rapidly transferred to the recovered PM and processing efficiency can be improved by performing the interrupt process at the time of recovery as shown in FIG. 8.

There is no limitation on the number of the processing chambers in the processing system of the present invention. In addition, the object to be processed used in the present invention is not limited to a silicon wafer, and it may be a substrate of quartz, glass, or the like.

Further, examples of the apparatus that performs a desired process in the processing chamber include, an etching apparatus, a chemical vapor deposition (CVD) apparatus, an ashing apparatus, a spattering apparatus, a coater developer, a cleaning apparatus, a chemical mechanical polishing (CMP) apparatus, a physical vapor deposition (PVD) apparatus, an exposure apparatus, an ion implanter, etc. These apparatuses may be embodied by a microwave plasma processing apparatus, an inductive coupled plasma processing apparatus, a capacity coupled plasma processing apparatus, etc.

Furthermore, the control device according to the present invention may be embodied by the EC 200 only, or may be embodied by the EC 200 and the MC 300.

What is claimed is:

1. A control device for a processing system, the processing system including a plurality of processing chambers in which a predetermined process is performed on an object to be processed, a storage port that stores objects to be processed, a transfer mechanism that transfers each object to be processed to a predetermined transfer destination between the plurality of processing chambers and the storage port, and pre-processing chambers that connect each of the processing chambers and the transfer mechanism, the control device comprising:
    a transfer destination determining portion that determines a transfer destination for each object to be processed that is stored in the storage port after a preceding object is removed from the storage port;
    a transfer destination change portion that, after transfer of one of the objects to be processed that is stored in the storage port to one of the plurality of processing chambers is inhibited, in accordance with a timing at which the inhibition of the transfer to the processing chamber is released, changes the transfer destination of one of the objects to be processed whose transfer destination has already been determined by the transfer destination determining portion and that is next to be transferred from the storage port among the objects to be processed, to the processing chamber that is released from the transfer inhibition; and
    an evacuation portion that evacuates, to the storage port, one of the objects to be processed that has been determined to be transferred to the processing chamber to which the transfer is inhibited and that has not yet been transferred to the processing chamber to which the transfer is inhibited, wherein
    the evacuation portion determines whether or not the object to be processed has been transferred based on whether the object to be processed has been transferred to a pre-processing chamber of the processing chamber to which the transfer is inhibited.

2. The control device for the processing system according to claim 1,
    wherein
    the transfer destination determining portion sequentially determines a new transfer destination for the evacuated object to be processed and transfer destinations for other objects to be processed stored in the storage port, and
    in accordance with the timing at which the inhibition of the transfer to the processing chamber is released, the transfer destination change portion changes the transfer destination of at least one of the objects to be processed whose transfer destination has already been determined, including the evacuated object to be processed for which the transfer destination determining portion has determined the new transfer destination, to the processing chamber that is released from the transfer inhibition.

3. The control device for the processing system according to claim 1, wherein, in accordance with a timing at which one of the objects to be processed is carried out of the storage port toward the transfer mechanism, the transfer destination determining portion determines a transfer destination of one of the objects to be processed that is next transferred from the storage port.

4. The control device for the processing system according to claim 1, wherein
    in accordance with a timing at which one of the objects to be processed is carried out by the transfer mechanism toward the pre-processing chamber, the transfer destination determining portion determines a transfer destination of one of the objects to be processed that is next transferred from the storage port.

5. The control device for the processing system according to claim 1, wherein, the processing system is a system that processes one of a wafer and a substrate.

6. The control device for the processing system according to claim 1, further comprising an alignment mechanism provided on an outside of the pre-processing chambers,
    wherein the evacuation portion changes a transfer destination of an object to be processed located in the alignment mechanism from the processing chamber to which the transfer is inhibited to the storage port.

7. The control device for the processing system according to claim 1, wherein, during periodic maintenance of any one of the plurality of processing chambers, or when an abnormality occurs in any one of the processing chambers, the evacuation portion determines that the transfer of one of the objects to be processed to the given processing chamber is inhibited.

8. The control device for the processing system according to claim 7, wherein, when the periodic maintenance is completed, or when the processing chamber in which the abnormality has occurred is recovered, the transfer destination change portion determines that the inhibition of the transfer to the given processing chamber is released.

9. A control method for a processing system that includes a plurality of processing chambers in which a predetermined process is performed on an object to be processed, a storage port that stores objects to be processed, a transfer mechanism that transfers each object to be processed to a predetermined transfer destination between the plurality of processing chambers and the storage port, and pre-processing chambers that connect each of the processing chambers and the transfer mechanism, the control method comprising the steps of:
    determining a transfer destination for each object to be processed that is stored in the storage port after a preceding object is removed from the storage port;
    changing, after transfer of one of the objects to be processed that is stored in the storage port to one of the plurality of processing chambers is inhibited, in accordance with a timing at which the inhibition of the transfer to the processing chamber is released, the transfer destination of one of the objects to be processed whose transfer destination has already been determined and that is next to be transferred from the storage port among the objects to be processed, to the processing chamber that is released from the transfer inhibition; and
    evacuating, to the storage port, one of the objects to be processed that has been determined to be transferred to the processing chamber to which the transfer is inhibited and that has not yet been transferred to the processing chamber to which the transfer is inhibited,
wherein
    the evacuating includes determining whether or not the object to be processed has been transferred based on whether the object to be processed has been transferred to a pre-processing chamber of the processing chamber to which the transfer is inhibited.

10. The control method for the processing system according to claim 9, further comprising changing a transfer destination of an object to be processed located in an alignment mechanism provided outside the pre-processing chambers from the processing chamber to which the transfer is inhibited to the storage port.

11. A storage medium storing a processing program that comprises instructions that command a computer to execute control of a processing system that includes a plurality of processing chambers in which a predetermined process is performed on an object to be processed, a storage port that stores objects to be processed, a transfer mechanism that transfers each object to be processed to a predetermined transfer destination between the plurality of processing chambers and the storage port, and pre-processing chambers that connect each of the processing chambers and the transfer mechanism, wherein
the processing program comprising the processes of:
  determining a transfer destination for each object to be processed that is stored in the storage port after a preceding object is removed from the storage port;
  changing, after transfer of one of the objects be processed that is stored in the storage port to one of the plurality of processing chambers is inhibited, in accordance with a timing at which the inhibition of the transfer to the processing chamber is released, the transfer destination of one of the objects to be processed whose transfer destination has already been determined and that is next to be transferred from the storage port among the objects to be processed, to the processing chamber that is released from the transfer inhibition; and
  evacuating, to the storage port, one of the objects to be processed that has been determined to be transferred to the processing chamber to which the transfer is inhibited and that has not yet been transferred to the processing chamber to which the transfer is inhibited, wherein
the evacuating includes determining whether or not the object to be processed has been transferred based on whether the object to be processed has been transferred to a pre-processing chamber of the processing chamber to which the transfer is inhibited.

12. The storage medium according to claim 11, further comprising changing a transfer destination of an object to be processed located in an alignment mechanism provided outside the pre-processing chambers from the processing chamber to which the transfer is inhibited to the storage port.

* * * * *